(12) United States Patent
Thean et al.

(10) Patent No.: US 7,700,420 B2
(45) Date of Patent: Apr. 20, 2010

(54) INTEGRATED CIRCUIT WITH DIFFERENT CHANNEL MATERIALS FOR P AND N CHANNEL TRANSISTORS AND METHOD THEREFOR

(75) Inventors: Voon-Yew Thean, Austin, TX (US);
Bich-Yen Nguyen, Austin, TX (US);
Mariam G. Sadaka, Austin, TX (US);
Victor H. Vartanian, Dripping Springs, TX (US); Ted R. White, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 629 days.

(21) Appl. No.: 11/402,395

(22) Filed: Apr. 12, 2006

(65) Prior Publication Data

US 2007/0241403 A1    Oct. 18, 2007

(51) Int. Cl.
*H01L 21/00* (2006.01)
*H01L 21/84* (2006.01)

(52) U.S. Cl. .............................. 438/154; 257/E21.603; 257/351

(58) Field of Classification Search .......... 257/E21.603, 257/351; 438/154
See application file for complete search history.

(56) References Cited

U.S. PATENT DOCUMENTS

| | | | |
|---|---|---|---|
| 5,929,486 A | * | 7/1999 | Kitakado .................. 257/345 |
| 6,831,350 B1 | * | 12/2004 | Liu et al. .................. 257/617 |
| 2004/0069991 A1 | | 4/2004 | Dunn et al. |
| 2005/0082531 A1 | * | 4/2005 | Rim .......................... 257/72 |
| 2005/0093104 A1 | | 5/2005 | Ieong et al. |
| 2005/0121729 A1 | | 6/2005 | Beach et al. |
| 2005/0145883 A1 | | 7/2005 | Beach et al. |
| 2006/0043571 A1 | | 3/2006 | Mousa et al. |
| 2006/0065930 A1 | | 3/2006 | Kelman |

OTHER PUBLICATIONS

Doris, B. et al.; A Simplified Hybrid Orientation Technology (SHOT) for High Performance CMOS; VLSI Technology, Digest of Technical Papers, 2004 Symposium; pp. 86-87.

(Continued)

*Primary Examiner*—W. David Coleman
*Assistant Examiner*—Sonya D McCall-Shepard
(74) *Attorney, Agent, or Firm*—James L. Clingan, Jr.; Joanna G. Chiu

(57) ABSTRACT

A substrate includes a first region and a second region. The first region comprises a III-nitride layer, and the second region comprises a first semiconductor layer. A first transistor (such as an n-type transistor) is formed in and on the III-nitride layer, and a second transistor (such as a p-type transistor) is formed in and on the first semiconductor layer. The III-nitride layer may be indium nitride. In the first region, the substrate may include a second semiconductor layer, a graded transition layer over the second semiconductor layer, and a buffer layer over the transition layer, where the III-nitride layer is over the buffer layer. In the second region, the substrate may include the second semiconductor layer and an insulating layer over the second semiconductor layer, where the first semiconductor layer is over the insulating layer.

9 Claims, 4 Drawing Sheets

OTHER PUBLICATIONS

Ghani, T. et al.; "A 90nm High Volume Manufacturing Logic Technology Featuring Novel 45nm Gate Length Strained Silicon CMOS Transistors"; IEDM 03; 2003; pp. 978-980; IEEE.

Jin, B. et al.; "Mobility enhancement in Compressively Strained SiGe channel pMOSFET with Hf02/TiN gate stack"; Abs/ 1293 206th Meeting, The Electrochemical Society, Inc.; 2004; 1 pg; The Electrochemical Society, Inc.

Mizuno, T. et al.; "Physical Mechanism for High Hole Mobility in (110)-Surface Strained-and Unstrained-MOSFETs"; IEDM 03; 2003; pp. 809-812; IEEE.

Yang, M. et al.; "High Performance Cmos Fabricated on Hybrid Substrate With Different Crystal Orientations"; IEDM 03; 2003; pp. 453-456; IEEE.

* cited by examiner

INTEGRATED CIRCUIT WITH DIFFERENT CHANNEL MATERIALS FOR P AND N CHANNEL TRANSISTORS AND METHOD THEREFOR

RELATED APPLICATIONS

This application is related to U.S. patent application Ser. No. 11/209,869, titled "Modified Hybrid Orientation Technology," by Bunmi et al., filed Aug. 23, 2005, and assigned to the assignee hereof.

FIELD OF THE INVENTION

This invention relates to making integrated circuits, and more particularly, to making integrated circuits in which P channel transistors have a different channel material than N channel transistors.

BACKGROUND OF THE INVENTION

Performance and behavior characteristics of electronic devices are heavily influenced by the material of the device active regions. Or example, P and N channel transistors have performance characteristics that depend on the material of the channels. Choosing the appropriate channel material for the different transistor types is important in optimizing or at least enhancing device performance. For example, P channel transistors are known to have better hole mobility using a silicon channel with a (110) crystal surface orientation than a silicon channel with a (100) crystal surface orientation, whereas N channel transistors are known to have better electron mobility using a silicon channel with a (100) crystal surface orientation than a silicon channel with a (110) crystal surface orientation. P and N channel transistor mobilities also depend on channel composition. For example, gallium arsenide improves electron mobility over silicon but does not improve hole mobility.

Thus, there is a benefit in a device structure, as well as a method for making that device structure, that uses different materials for the channels of P and N channel transistors.

BRIEF DESCRIPTION OF THE DRAWINGS

The foregoing and further and more specific objects and advantages of the invention will become readily apparent to those skilled in the art from the following detailed description of a preferred embodiment thereof taken in conjunction with the following drawings.

DETAILED DESCRIPTION OF THE INVENTION

In one aspect a device structure preferably uses indium nitride for the channel of the N channel transistors and a different material, such as (100) silicon or germanium, for the channels of the P channel transistors. A method for making the device includes a growing a transition layer from an underlying semiconductor layer then a buffer layer to establish a defect free layer on which to grow the indium nitride. A semiconductor material different from indium nitride, such as aluminum nitride, indium antimonide, and gallium nitride, may also be found to be useful for the channel material for the N channel transistors. This is better understood by reference to the drawings and the following description.

Figure 1:
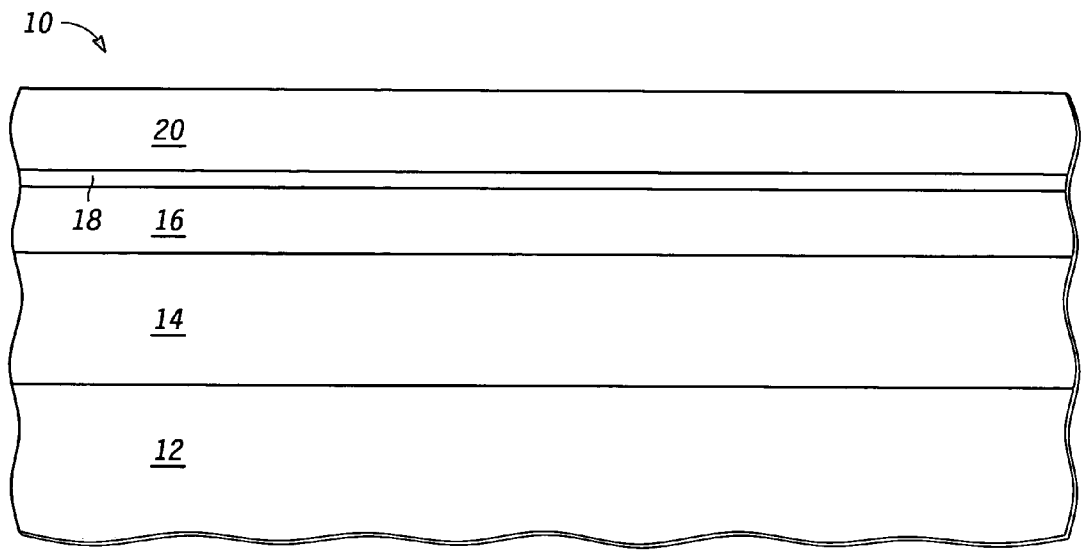
FIG. 1 is a cross section of a semiconductor device at a stage in a process that is according to an embodiment of the invention.

Shown in FIG. 1 is a semiconductor device structure 10 having a semiconductor layer 12, a dielectric layer 14 on semiconductor layer 12, and a semiconductor layer 16 on dielectric layer 14, an oxide layer 18 on semiconductor layer 16, and a nitride layer 20 on oxide layer 18. This can be a semiconductor on insulator (SOI) substrate of the type that is now readily available in which semiconductor layer 16 is silicon with a (110) crystal surface orientation, which is beneficial for P channel transistors, and semiconductor layer 12 is silicon with a (100) crystal surface orientation. A variety of other alternatives, however, are possible; such as semiconductor layer 16 being germanium, silicon germanium, or strained silicon to enhance P channel transistor performance. Semiconductor layer 12 is relatively thick, about 700 microns is typical, and in addition to having utility as a semiconductor, provides structural support. Dielectric layer 14 is preferably about 1400 Angstroms thick. Semiconductor layer 16 is preferably about 700 Angstroms thick. Oxide layer 18 is preferably about 100 Angstroms thick. Nitride layer 20 is preferably about 1200 Angstroms. These thicknesses can all vary substantially.

Figure 2:
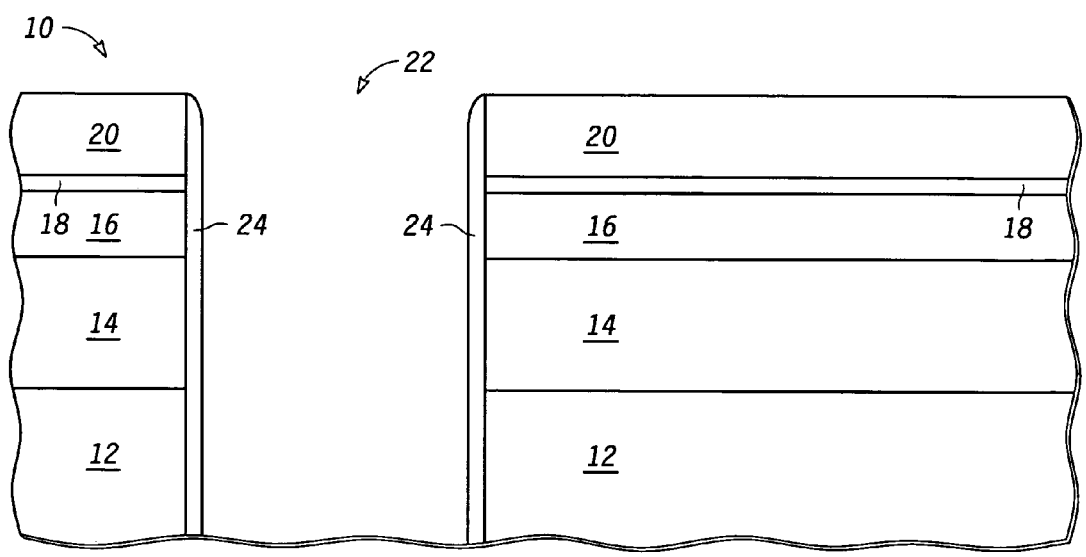
FIG. 2 is a cross section of the semiconductor device at a stage in the process subsequent to that shown in FIG. 1.

Shown in FIG. 2 is semiconductor device structure 10 after a patterned etch through nitride layer 20, oxide layer 18, dielectric layer 14, and about 1000 Angstroms into semiconductor layer 12 to form an opening 22 and a sidewall spacer 24 along the interior sidewall of opening 22. Sidewall spacer is preferably nitride and is preferably relatively thin, about 100 Angstroms. Opening 22 at its bottom exposes a portion of semiconductor layer 12.

Figure 3:
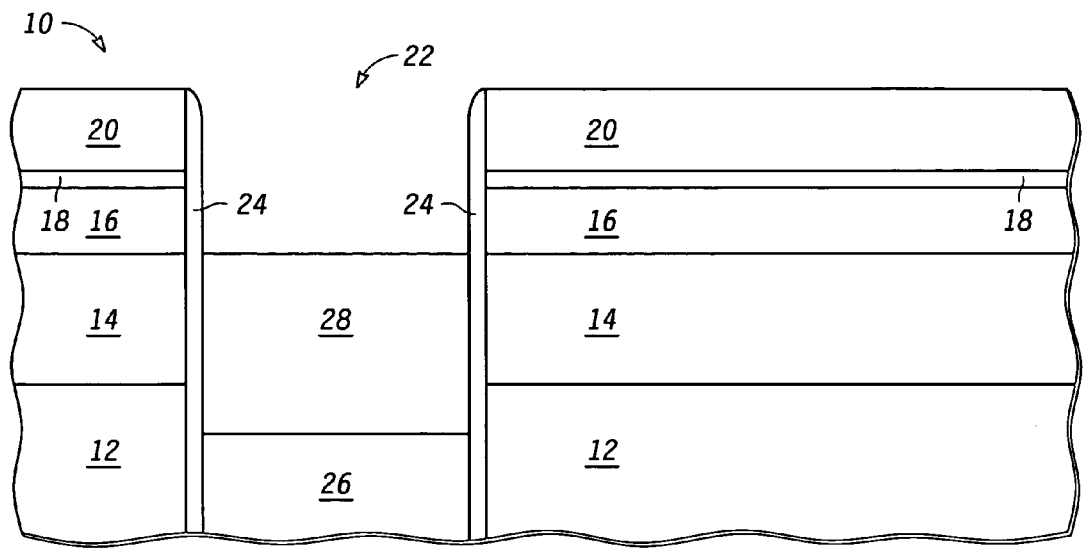
FIG. 3 is a cross section of the semiconductor device at a stage in the process subsequent to that shown in FIG. 2.

Shown in FIG. 3 is semiconductor device structure 10 after epitaxially growing an interface layer 26 and a buffer layer 28. Interface layer 26 is graded silicon germanium that begins with a low concentration of germanium and ends with a concentration of 100 percent germanium. Interface layer 26 can also thus be considered a transition layer. The thickness of interface layer 26 is chosen so that the lattice orientation and crystal quality can be maintained during the transition from the underlying silicon of semiconductor layer 12 to the pure germanium at the top surface of interface layer 26. The generally accepted rule for silicon to germanium is a 10 percent increase in germanium per micron of thickness, or approximately 10 microns for this example. With special techniques that increase process complexity, such as using strain relief buffer layers, the thickness for transition layer 26 can be reduced. Buffer layer 28 is preferably pure germanium for providing a substantially defect-free crystal lattice at its top surface. The top surface of interface layer 26 will be expected to have defects, but they can be substantially if not completely eliminated by growing buffer layer 28 to about 1000 Angstroms.

Figure 4:
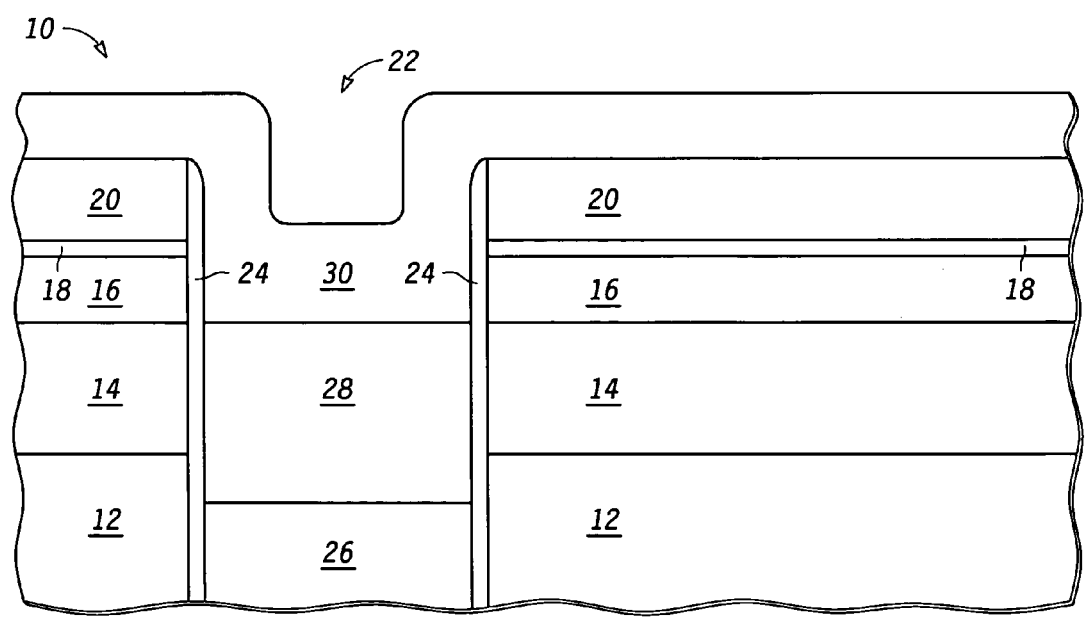
FIG. 4 is a cross section of the semiconductor device at a stage in the process subsequent to that shown in FIG. 3.

Shown in FIG. 4 is semiconductor device structure 10 after formation of a semiconductor layer 30 of preferably indium nitride. Over buffer layer 28, semiconductor layer 30 is deposited by epitaxial growth to match the lattice dimensions of buffer layer 28. The deposition of semiconductor layer 30, being of indium nitride, is not selective so that semiconductor layer 30 is also formed over nitride layer 20. Semiconductor layer 30 is preferably about 1500 Angstroms thick. It should be above the level of oxide layer 18. The material for semiconductor layer 30 is preferably indium nitride and is chosen for enhancing N channel transistor performance. Other materials that are also enhancing for N channel transistors include gallium nitride, indium antimonide, and aluminum nitride. Materials are sometimes grouped by their location in the periodic table. In this case aluminum, gallium, and indium are in group III. Other group III materials are boron and thallium which are also possible candidates in combination with nitrogen for use as semiconductor layer 30. Thus, although indium nitride has particularly beneficial characteristics for enhancing N channel transistor performance, any group III-nitride material is a candidate.

Figure 5:
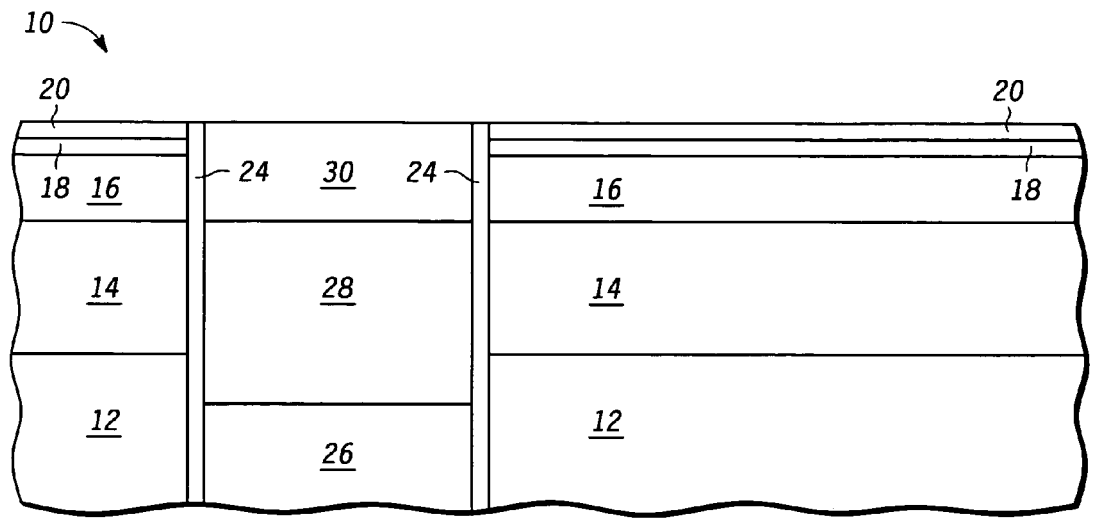
FIG. 5 is a cross section of the semiconductor device at a stage in the process subsequent to that shown in FIG. 4.

Shown in FIG. 5 is semiconductor device structure 10 following chemical mechanical polishing (CMP) of semiconductor layer 30 and nitride layer 20. Nitride layer 20 is preferably not completely removed so that about 100 Angstroms of nitride layer 20 remains and the top surfaces of the remaining portion of nitride layer 20 and semiconductor layer 30 are coplanar.

Figure 6:
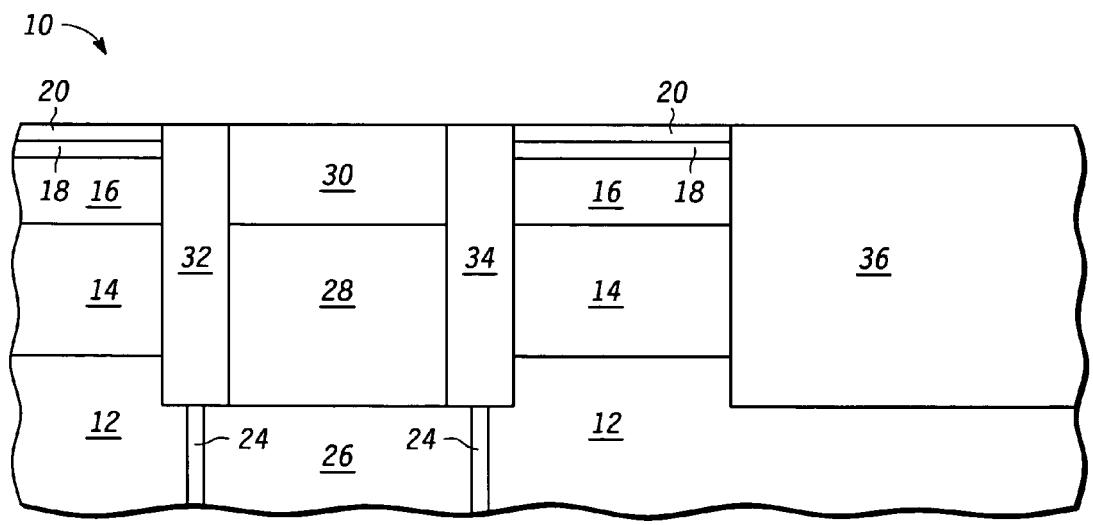
FIG. 6 is a cross section of the semiconductor device at a stage in the process subsequent to that shown in FIG. 5.

Shown in FIG. 6 is semiconductor device structure 10 after formation of isolation regions 32, 34, and 36. A portion of semiconductor layer 30 is consumed in the process of forming isolation regions 32 and 34. The result is that semiconductor layer 30 is bordered by isolation regions 32 and 34. An active region for forming P channel transistors is between isolation regions 34 and 36. Processes for forming isolation regions are well known and can be used for forming isolation regions 32, 34, and 36. Isolation regions 32, 34, and 36 extend into semiconductor layer 12. The result is the ability to form P channel transistors that are SOI transistors and N channel transistors that are substantially bulk transistors.

Figure 7:
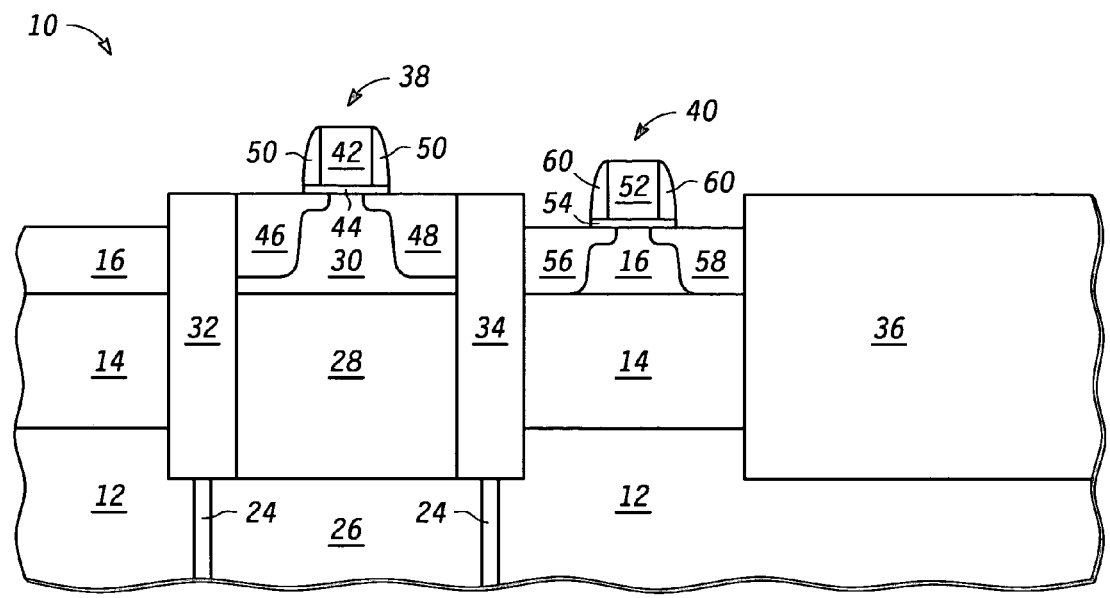
FIG. 7 is a cross section of the semiconductor device at a stage in the process subsequent to that shown in FIG. 6.

Shown in FIG. 7 is semiconductor device structure 10 after formation of an N channel transistor 38 and a P channel transistor 40. Transistor 38 has a gate 42 over semiconductor layer 30, a gate dielectric 44 between semiconductor layer 30 and gate 42, a source/drain 46 in semiconductor layer 30 on one side of gate 42, a source/drain 48 in semiconductor layer 30 on the other side of gate 42, and a sidewall spacer 50 around gate 42. Transistor 40 has a gate 52 over semiconductor layer 16, a gate dielectric 54 between semiconductor layer 16 and gate 52, a source/drain 56 in semiconductor layer 16 on one side of gate 52, a source/drain 58 in semiconductor layer 16 on the other side of gate 52, and a sidewall spacer 60 around gate 52.

Thus, it is seen that a method using available processing technologies can be used to obtain different enhancing channel materials for N and P channel transistors. The preferred indium nitride has a lattice constant close to that of germanium which can be made using silicon as a staring point. Electron mobility is more than two times greater for indium nitride than for silicon. As geometries continue to shrink and high k gate dielectrics increase in use, effective vertical electric fields are increasing. The result is that saturation velocity is replacing mobility as the dominant characteristic in determining transistor drive current. Electron saturation velocity for indium nitride is about 2.5 times the saturation velocity for silicon.

Various other changes and modifications to the embodiments herein chosen for purposes of illustration will readily occur to those skilled in the art. For example, the isolation regions were described as using an existing process, but the isolation regions could be made using a process that is subsequently developed. To the extent that such modifications and variations do not depart from the spirit of the invention, they are intended to be included within the scope thereof which is assessed only by a fair interpretation of the following claims.

The invention claimed is:

1. A method for forming a semiconductor structure, comprising:
   providing a substrate having a first semiconductor layer, an insulating layer over the first semiconductor layer, and a second semiconductor layer over the insulating layer, the substrate having a first region and a second region, wherein the first semiconductor layer has a first crystal surface orientation and the second semiconductor layer has a second crystal surface orientation different from the first surface crystal orientation;
   forming an opening in the first region extending through the insulating layer and into the first semiconductor layer;
   epitaxially growing a transition layer in the opening so that the transition layer has the first crystal surface orientation;
   epitaxially growing a buffer layer over the transition layer in the opening so that the transition layer has the first crystal surface orientation;
   epitaxially growing a III-nitride layer over the buffer layer so that the transition layer has the first crystal surface orientation;
   forming a first transistor in and on the III-nitride layer in the first region; and
   forming a second transistor in and on the second semiconductor layer in the second region.

2. The method of claim 1, wherein the first semiconductor layer comprises silicon, the transition layer comprises graded silicon germanium, and the buffer layer comprises germanium.

3. The method of claim 1, wherein the second semiconductor layer has higher carrier mobility for p-type transistors than n-type transistors and the III-nitride layer has higher carrier mobility for n-type transistors than p-type transistors.

4. The method of claim 1, wherein a lattice constant of the buffer layer is within approximately one percent of a lattice constant of the III-nitride layer.

5. The method of claim 1, further comprising forming a sidewall spacer in the opening before the step of epitaxially growing the transition layer.

6. The method of claim 2, wherein the transition layer has approximately 0% germanium nearest the first semiconductor layer and approximately 100% germanium nearest the buffer layer.

7. The method of claim 2, wherein the III-nitride layer comprises indium and nitride.

8. The method of claim 7, wherein the first transistor is a p-type transistor and the second transistor is an n-type transistor.

9. The method of claim 8, wherein the first semiconductor layer has higher carrier mobility for p-type transistors than n-type transistors and the III-nitride layer has higher carrier mobility for n-type transistors than p-type transistors.

* * * * *